US006262619B1

(12) United States Patent
McGreer et al.

(10) Patent No.: US 6,262,619 B1
(45) Date of Patent: Jul. 17, 2001

(54) METHOD AND SYSTEM FOR POWER AMPLIFIER OFFSET NULLING

(75) Inventors: Brooke McGreer, San Jose; Bryan Scott Rowan, Los Gatos, both of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/300,652

(22) Filed: Apr. 27, 1999

(51) Int. Cl.[7] ........................................................ H03L 5/00
(52) U.S. Cl. ............................................. 327/307; 327/362
(58) Field of Search .................................. 360/75, 78.04, 360/77.04, 78.05; 318/634; 327/307, 513, 362, 378

(56) References Cited

U.S. PATENT DOCUMENTS

| | | | |
|---|---|---|---|
| 4,821,125 | 4/1989 | Christensen et al. ................... | 360/31 |
| 4,969,059 | * 11/1990 | Volz et al. .......................... | 360/78.04 |
| 5,061,900 | * 10/1991 | Vinn et al. ................................. | 330/9 |
| 5,191,297 | 3/1993 | Penman et al. ........................ | 330/146 |
| 5,262,907 | * 11/1993 | Duffy et al. ........................ | 360/77.05 |
| 5,451,895 | * 9/1995 | Lim ........................................ | 327/351 |
| 5,654,840 | 8/1997 | Patton et al. ........................... | 360/75 |
| 5,677,809 | 10/1997 | Kadlec ............................... | 360/78.09 |
| 5,781,362 | 7/1998 | Bang ................................. | 360/78.05 |
| 5,883,749 | * 3/1999 | Park ........................................ | 360/75 |

* cited by examiner

*Primary Examiner*—Tuan T. Lam
*Assistant Examiner*—Hiep Nguyen
(74) *Attorney, Agent, or Firm*—Sawyer Law Group LLP; Randall J. Bluestone

(57) ABSTRACT

Method and system aspects for nulling output offset current in an amplifier are described. In an exemplary method aspect, the method includes determining at least one offset value with a power amplifier in at least one mode. The at least one offset value then utilized to identify an output offset current value in the power amplifier. An adjustment to an input signal to the power amplifier occurs until the output offset current value is substantially nulled to identify a power amplifier offset value.

18 Claims, 4 Drawing Sheets

METHOD AND SYSTEM FOR POWER AMPLIFIER OFFSET NULLING

RELATED APPLICATIONS

The present application is related to U.S. patent application Ser. No. (SA999055/1307P), entitled METHOD AND SYSTEM FOR PROVIDING SPINDLE MOTOR CONTROL FOR HEAD LOADING IN A DISK DRIVE (SA999055/1307P), and assigned to the assignee of the present invention.

FIELD OF THE INVENTION

The present invention relates to power amplifiers, and more particularly to nulling output offset current in power amplifiers.

BACKGROUND OF THE INVENTION

Power amplifiers have been widely used as a final stage in multistage amplifiers, such as in audio amplifiers and radio transmitters, to deliver maximum power to a load, rather than maximum voltage gain, for a given percentage of distortion. One particular application of a power amplifier is in a disk drive device. In essence, a power amplifier acts as a transconductance amplifier and takes an input voltage and converts it into an output current to drive a voice coil motor (VCM).

FIG. 1, a disk drive 10 is shown, which contains one or more magnetic disks 12 that spin about a spindle 14. Data is written with onto disks 12 by a read/write head 16, and information is read back using the same read/write head 16. Read/write head 16 is attached to the bottom of a suspension 18 which is part of an actuator 20 that rotates about a pivot point 22. Actuator 20 is moved by current through a voice-coil motor 24. Crash stops (26 and 28) limit the travel of actuator 20. FIG. 2 shows a first close-up view of a load and unload ramp. FIG. 3 shows a second close-up view of the load and unload ramp.

A close-up view of load/unload ramp 30 is shown in FIGS. 2 and 3. While only a single disk and two heads are shown, multiple disks and multiple sets of heads are also possible. Disk 12 is mounted on spindle 22 and is rotated by a spindle motor 40. Read/write heads 16 are attached to suspensions 18 that contain tabs 32. Before disk 12 is stopped, tabs 32 are pushed onto load/unload ramp 30 which is attached to base plate 42 of disk drive 10 by a mounting screw 44 or other fastening means. Heads 16 are lifted off disk 12 by tab 32 on the end of suspension 18 that travels up load/unload ramp 30.

FIG. 3 is a top view of the arrangement shown from the side in FIG. 2 and illustrates the direction 46 which tab 32 moves when the tip of suspension 18 is pushed onto load/unload ramp 30 before disk 12 is stopped.

FIG. 4 illustrates a portion of a disk drive device controller, e.g., a load/unload controller, that illustrates a power amplifier 110 coupled to a load comprising a sensing resistor 112, Rs, and a VCM 114. When a control output signal having a zero voltage value is transmitted to the power amplifier 110 after conversion to analog form through a digital-to-analog (D/A) converter 116, an output current from the power amplifier may be non-zero due to the intrinsic offsets of the components forming the power amplifier 110. The non-zero output current is generally known as the output offset current.

The problem with the output offset current is that it can be large in high-performance disk drives due to the low resistance of the current sensing resistor 112. For example, a power amplifier 110, whose current sensing amplifier 118 has 5 mV (millivolts) of input offset voltage and uses a 200 milliohm sensing resistor 112, can have an output offset current on the order of 25 milliamperes. In a high performance disk drive with relatively large torque constants, an offset current of that value is enough to generate sufficient torque to move the actuator of the disk drive, which can be a problem in drives with a ramp for head loading, if the force of the heads on the ramp and the ramp's coefficient of friction are low enough to be overcome by this torque. This is especially true if the actuator is not normally mechanically latched when the heads are in the unloaded position. The result could be accidental head loading or unloading due to the output offset current alone if it is not sufficiently reduced or eliminated.

Accordingly, what is needed is a system and method for nulling the output offset current in a power amplifier. The present invention addresses such a need.

SUMMARY OF THE INVENTION

Method and system aspects for nulling output offset current in an amplifier are described. In an exemplary method aspect, the method includes determining at least one offset value with a power amplifier in at least one mode. The at least one offset value is then utilized to identify an output offset current value in the power amplifier. An adjustment to an input signal to the power amplifier occurs until the output offset current value is substantially nulled to identify a power amplifier offset value. Further included is supplying the power amplifier offset value to the power amplifier with a zero value control output voltage to ensure substantially zero output offset current in the power amplifier.

Through the present invention, a power amplifier is calibrated and the results of the storage of the calibration allows use for future reference or as an initial starting point for subsequent offset adjustments. The digital nature of the adjustment allows for fast and easy customization of offset compensation in a manufacturing environment. These and other advantages of the aspects of the present invention will be more fully understood in conjunction with the following detailed description and accompanying drawings.

DETAILED DESCRIPTION

The present invention relates to output offset current nulling in a power amplifier. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention provides an offset-calibrated control loop that drives the output offset current of the voice coil motor (VCM) power amplifier to negligible levels. The control loop is preferably implemented in firmware utilizing hardware that is already available. It is low cost, adjusts quickly to prevent significant, unwanted actuator motion, and does not impact other areas of servo performance.

Figure 1:
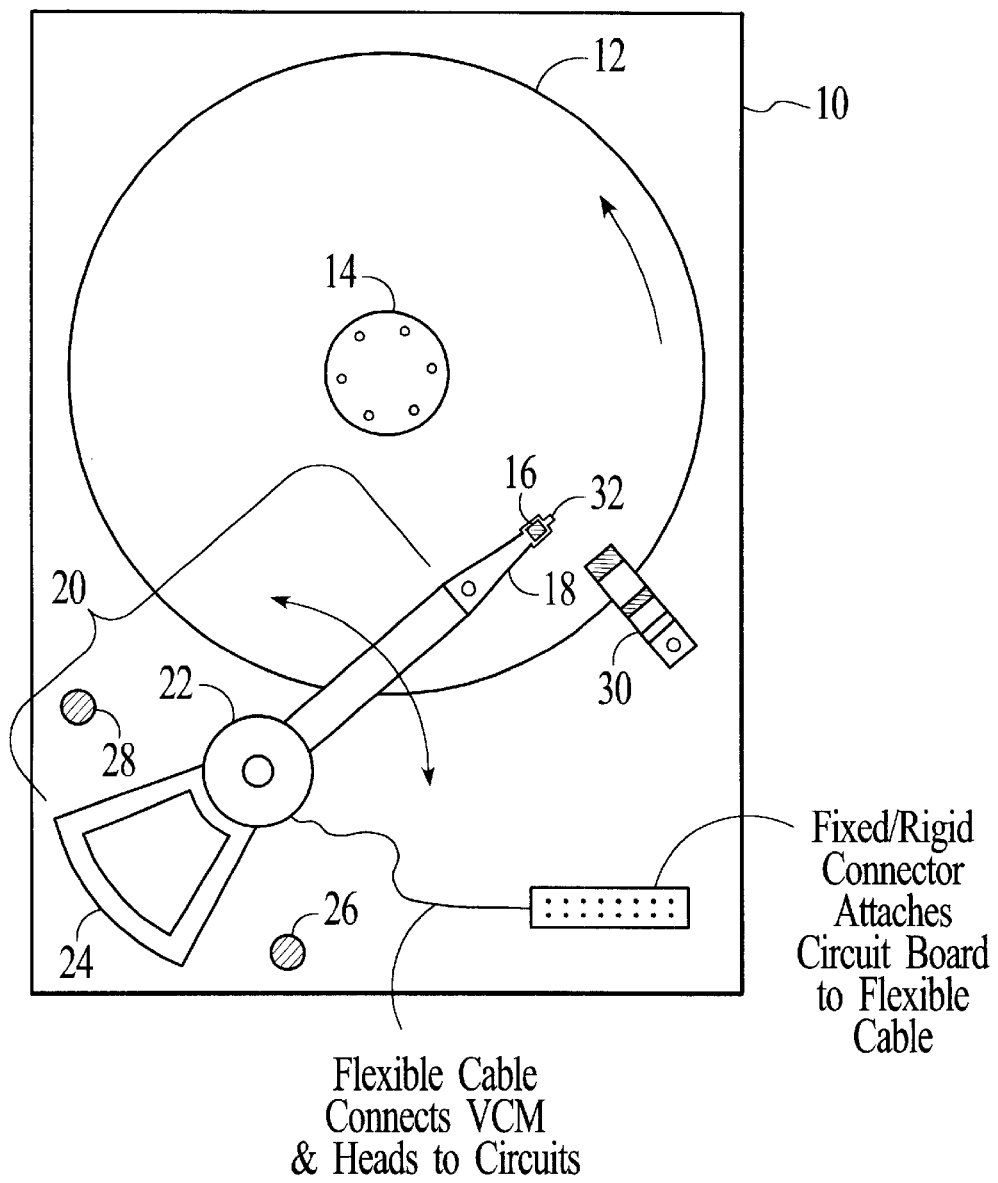
FIG. 1 shows a load/unload ramp.
Figure 2:
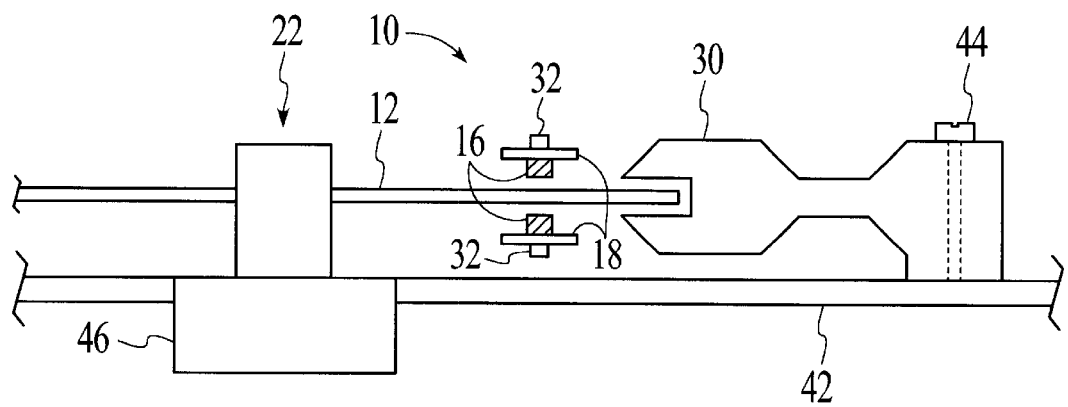
FIG. 2 shows a first close-up view of load and unload ramp.
Figure 3:
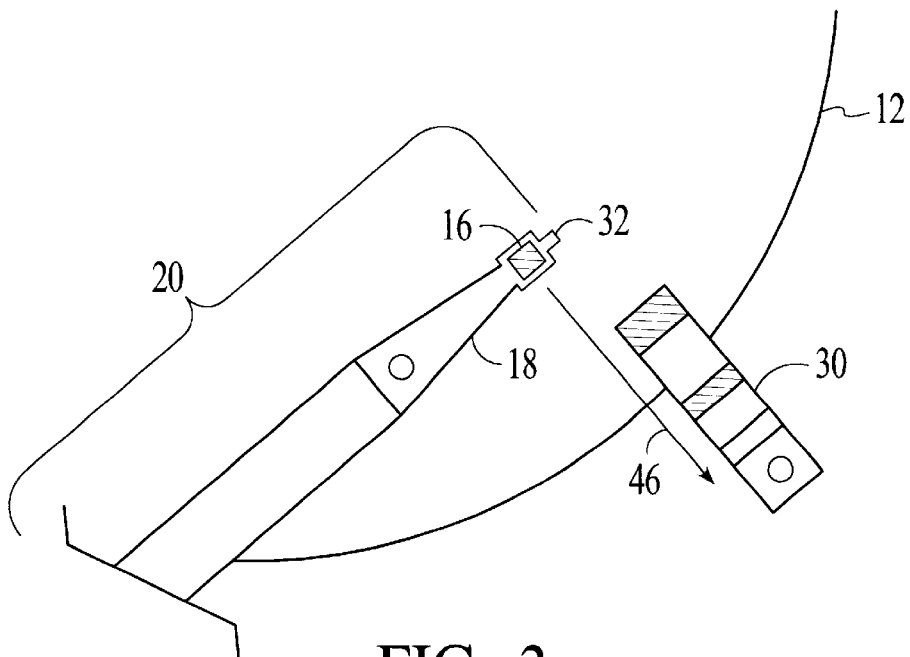
FIG. 3 shows a second close-up view of the load and unload ramp.
Figure 4:
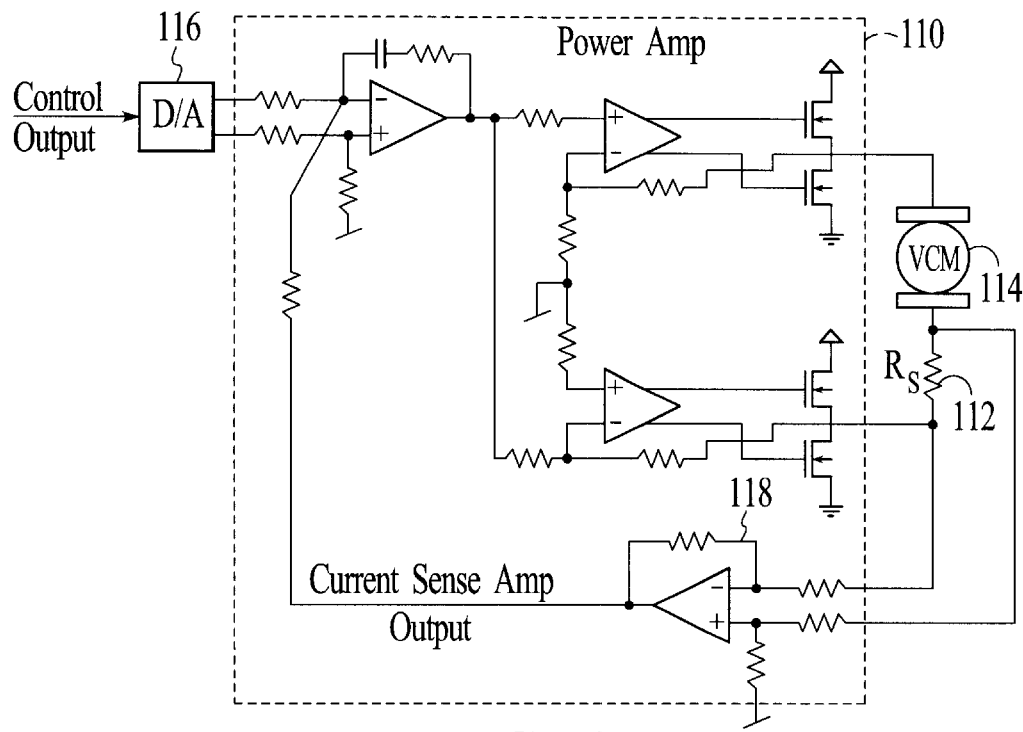
FIG. 4 illustrates a conventional power amplifier.
Figure 5:
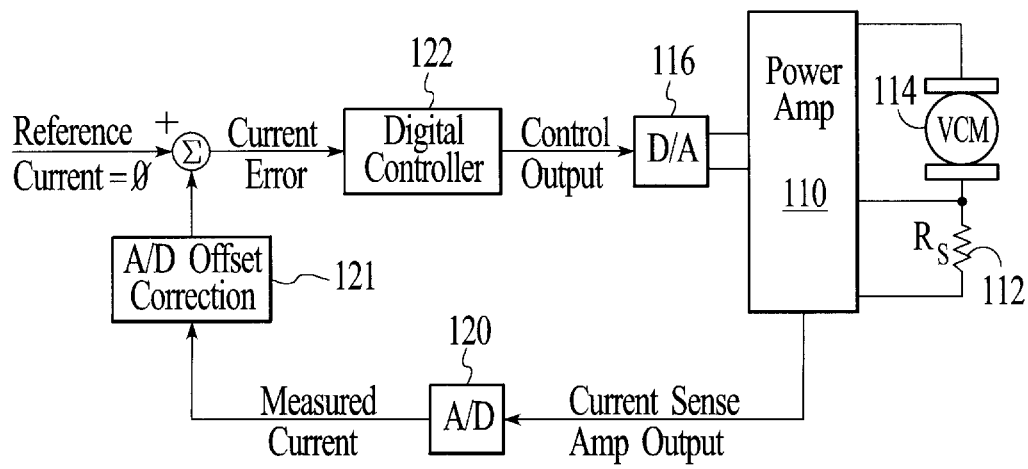
FIG. 5 illustrates an offset-calibrated control loop in accordance with the present invention.
Figure 6:
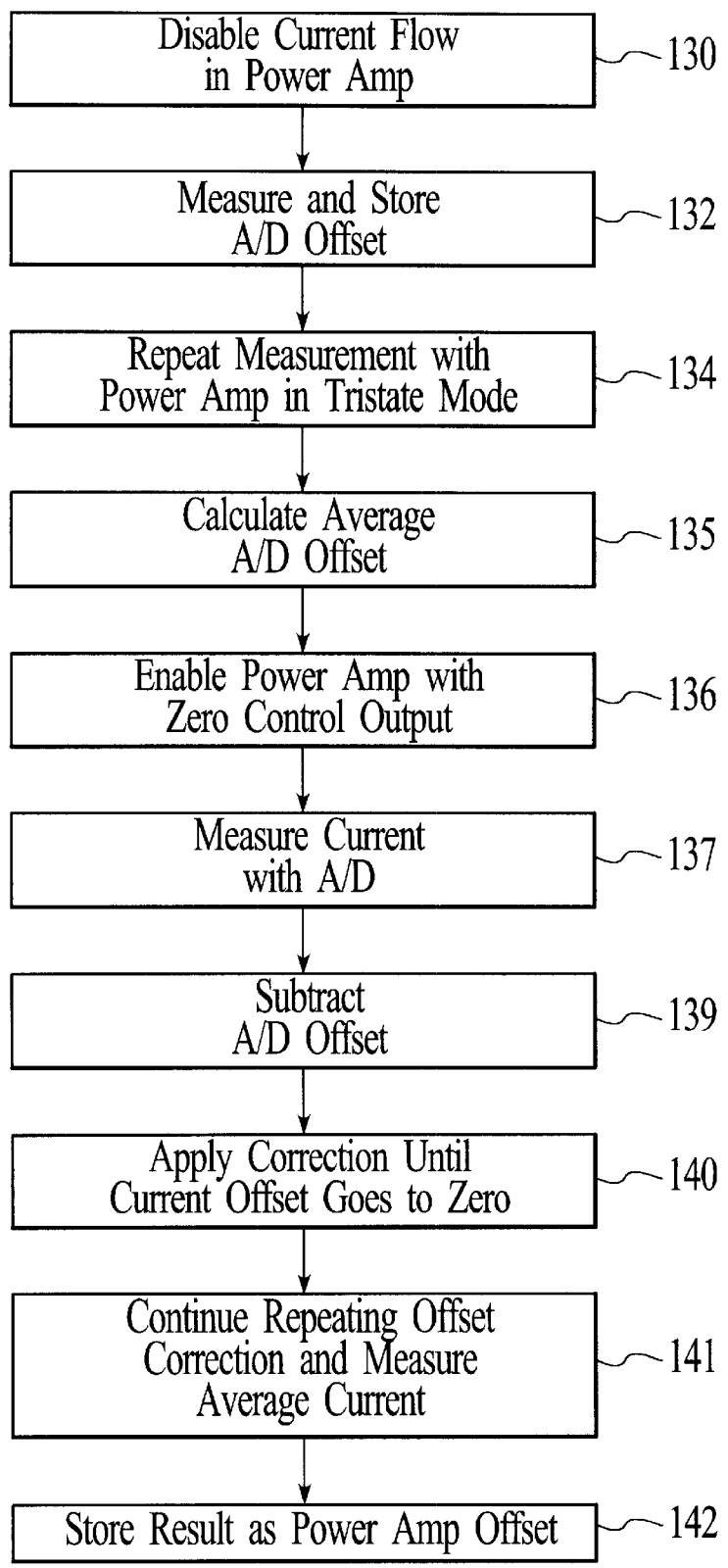
FIG. 6 illustrates a block flow diagram of a process for utilizing the offset-calibrated control loop of FIG. 2.

FIG. 5 illustrates an offset-calibrated control loop in accordance with the present invention, while FIG. 6 illustrates a block flow diagram of a process for utilizing the offset-calibrated control loop. As shown in FIG. 5, the present invention includes an analog-to-digital converter (A/D) 120 that is used for feeding current information of the VCM 114 back to a digital controller 122 of the digital servo system and to measure output offset current of e power amplifier 110. To measure the output offset current accurately, the offset of the A/D 120 first must be determined.

By manipulating the states of the power amplifier 110, the offset of the A/D 120 can be determined. Referring now to FIG. 6, the process involves disabling current in the power amplifier 110 by placing the power amplifier 110 in "brake" mode, where the outputs force the load (i.e., VCM 114 plus sensing resistor 112 in series) terminals to ground (step 130). The current is measured with the A/D 120 and the value is stored in system memory (not shown) (step 132). Disabling of current through the power amplifier 110 feeds back a measurement of the A/D 120 offset plus any residual leakage or recirculation current flowing through the sensing resistor 112. The measurement and storage are then repeated with the power amplifier in "tristate" mode, where the outputs float to a level determined by power amplifier biases (step 134), which will feed back the A/D 120 offset including leakage current through the VCM sensing resistor 112. To minimize the possibility for measurement errors, the VCM 114 is forced to be in a stationary state prior to the calibration by going through a series of brake and tristate conditions of sufficient duration. If the heads are unloaded, the series will not generate any current, which will not generate any torque or cause accidental loading. If the heads are loaded, it will result in the actuator being positioned at the point where the horizontal mechanical torques are balanced and will not cause violent crash stop impacts.

With knowledge of the power amplifier configuration, the A/D 120 offset measurements can be used to adjust the measured VCM current to an accurate magnitude. First the average A/D offset is calculated (step 135). Then, the power amplifier is enabled with a control output signal of zero transmitted (step 136). The output offset current is then measured (step 137). Thereafter, measurement offset errors are subtracted (step 139), i.e., the current sense amp output signal less the stored value for the measured A/D offset provides the current offset of the power amplifier 110 via A/D offset correction 122. This offset adjusted measurement is fed back to the digital controller 122 which adjusts the D/A 116 control signal feeding the power amplifier 110 until the 'measured current' in the power amplifier 110 is zero, which provides the adjustment value that substantially nulls the output offset current in the power amplifier (step 140). Then, the offset correction is repeated and the average current is measured (step 141). The adjustment needed is then stored as the power amplifier offset that is applied to the control output to account for the offset current in the power amplifier (step 142).

The calibration of the present invention can be repeated as often as is necessary to compensate for environmental variations affecting output offset current The storage of the results of the calibration allows use for future reference or as an initial starting point for subsequent offset adjustments. The digital nature of the adjustment allows for fast and easy customization of offset compensation in a manufacturing environment.

With the output offset current sufficiently reduced in this way, the remaining load or unload procedures in the disk drive can be completed in the normal manner without concern of offset currents generating an unwanted torque on the actuator. In addition, the preferred approach has the advantage of achieving the desired results quickly, without spending excessive time determining machine states, and at no additional cost beyond the firmware. It also does not impact normal servo-mechanical performance.

Furthermore, the present invention achieves the offset nulling without requiring a reduction in the input offset voltage of the sensing amplifier, which would require sorting and/or trimming of components, which, in turn, may lower yield and will increase costs to produce a low offset power amplifier. Additionally, the present invention avoids an increase in the resistance of the sensing resistor, which would reduce output offset current seen at the VCM at the expense of increased series resistance. Thus, by avoiding an increased resistance, the present invention avoids consumption of power supply voltage headroom and degradation of move time performance. By avoiding an increase to the torque required to move the actuator to a level that is beyond what is expected from the power amplifier output offset current, the present invention avoids placing additional mechanical design constraints on the system that may impact performance, power consumption and/or reliability. As is preferred, the present invention allows the VCM to be designed for performance without having to be constrained by the head loading/unloading operation and allows the ramp friction to be minimized to allow reliable loading and unloading and reduce the possibility of wear or contamination.

Although the present invention has been described in accordance with the embodiments shown, one of ordinary skill in the art will readily recognize that there could be variations to the embodiments and those variations would be within the spirit and scope of the present invention. Accordingly, many modifications may be made by one or ordinary skill in the art without departing from the spirit and scope of the appended claims.

What is claimed is:

1. A method for power amplifier offset nulling, the method comprising the steps of:

a) determining at least one offset value with a power amplifier in at least one mode, including:

a1) determining a first offset value with the power amplifier in a first mode; and a2) determining a second offset value with the power amplifier in a second mode;

b) utilizing the at least one offset value to identify an output offset current value in the power amplifier; and c) adjusting an input signal to the power amplifier until the output offset current value is substantially nulled to identify a power amplifier offset value.

2. The method of claim 1, wherein the first mode comprises a brake mode.

3. The method of claim 2, wherein determining a first offset value further comprises measuring offset currents through an analog-to-digital converter and a sensing resistor for storage as the first offset value.

4. The method of claim 1 wherein the second mode comprises a tristate mode.

5. The method of claim 4 wherein determining a second offset value further comprises measuring offset currents through an analog-to-digital converter and a sensing resistor for storage as the second offset value.

6. The method of claim 1 further comprising the step of supplying the power amplifier offset value to the power amplifier with a zero value control output voltage to ensure substantially zero output offset current in the power amplifier.

7. A method for power amplifier offset nulling, the method comprising the steps of:
   a) determining at least one offset value with a power amplifier in at least one mode;
   b) utilizing the at least one offset value to identify an output offset current value in the power amplifier in a disk drive; and
   c) adjusting an input signal to the power amplifier until the output offset current value is substantially nulled to identify a power amplifier offset value.

8. The method of claim 7 further comprising supplying the power amplifier offset when the disk drive is in a parked state.

9. A method for calibrating a power amplifier to achieve power amplifier offset nulling comprising the steps of:
   a) determining at least one offset with disabled current flow in a power amplifier, including determining current offsets through an analog-to-digital converter and a sensing resistor when the power amplifier is in first and second modes;
   b) applying a control output with a zero voltage value to the power amplifier;
   c) utilizing the at least one offset to determine an output offset current in the power amplifier; and
   d) determining a necessary adjustment to the control output to substantially null the output offset current.

10. The method of claim 9 further comprising storing the necessary adjustment as a power amplifier offset.

11. The method of claim 10 further comprising applying the power amplifier offset during subsequent applications of a zero control output to ensure substantially zero offset current in the power amplifier.

12. The method of claim 9 wherein the first mode further comprises a brake mode.

13. The method of claim 9 wherein the second mode further comprises a tristate mode.

14. A power amplifier offset nulling system comprising:
   a power amplifier;
   a load coupled to the power amplifier;
   an analog-to-digital (A/D) converter coupled to the power amplifier; and
   a controller coupled for providing a control output signal to the power amplifier and for providing an amplifier offset value as an adjustment necessary to ensure power amplifier offset nulling for a zero value control output signal in accordance with calibrated offset values for the load and A/D converter, wherein the calibrated offset values further comprise offset values determined with the power amplifier in a brake mode and in a tristate mode.

15. The system of claim 14 wherein the load further comprises a sensing resistor.

16. The system of claim 15 further comprising a voice coil motor coupled to the sensing resistor.

17. The system of claim 16 wherein the voice coil motor comprises a voice coil motor of a load/unload controller of a disk drive.

18. A computer readable medium containing program instructions for calibrating a power amplifier to achieve power amplifier offset nulling comprising:
   determining offsets with disabled current flow in a power amplifier including determining current offsets through an analog-to-digital converter and a sensing resistor when the power amplifier is in first and second modes;
   applying a control output with a zero voltage value to the power amplifier;
   utilizing the offsets to determine an output offset current in the power amplifier; and
   determining a necessary adjustment to the control output to substantially null the output offset current.

* * * * *